(12) United States Patent
Cygan et al.

(10) Patent No.: US 10,777,724 B2
(45) Date of Patent: Sep. 15, 2020

(54) HYBRID SOLAR SYSTEM

(71) Applicants: GAS TECHNOLOGY INSTITUTE, Des Plaines, IL (US); THE REGENTS OF THE UNIVERSITY OF CALIFORNIA, ON BEHALF OF ITS MERCED CAMPUS, Merced, CA (US); THE REGENTS OF THE UNIVERSITY OF CALIFORNIA, ON BEHALF OF ITS BERKELEY CAMPUS, Berkeley, CA (US)

(72) Inventors: David Cygan, Villa Park, IL (US); Hamid Abbasi, Naperville, IL (US); Aleksandr Kozlov, Buffalo Grove, IL (US); Roland Winston, Merced, CA (US); Eli Yablonovitch, Oakland, CA (US)

(73) Assignees: Gas Technology Institute, Des Plaines, IL (US); The Regents of the University of California on behalf of its Merced Campus, Merced, CA (US); The Regents of the University of California on behalf of its Berkley Campus, Berkley, CA (US)

( * ) Notice: Subject to any disclaimer, the term of this patent is extended or adjusted under 35 U.S.C. 154(b) by 0 days.

(21) Appl. No.: 16/049,205

(22) Filed: Jul. 30, 2018

(65) Prior Publication Data

US 2018/0358528 A1  Dec. 13, 2018

Related U.S. Application Data

(63) Continuation of application No. 14/959,874, filed on Dec. 4, 2015, now abandoned.

(Continued)

(51) Int. Cl.
H01L 35/02 (2006.01)
H01L 31/046 (2014.01)
(Continued)

(52) U.S. Cl.
CPC ............ *H01L 35/02* (2013.01); *H01L 31/046* (2014.12); *H02S 40/22* (2014.12); *H02S 40/44* (2014.12);
(Continued)

(58) Field of Classification Search
CPC .. F24S 2023/84; H01L 31/0735; H02S 40/22; H02S 40/44; Y02E 10/52; Y02E 10/60
See application file for complete search history.

(56) References Cited

U.S. PATENT DOCUMENTS 3,908,632 A * 9/1975 Poulsen ................. F24S 80/20
126/643
3,976,508 A   8/1976 Mlavsky
(Continued)

OTHER PUBLICATIONS

Cancarb ("Safety Data Sheet: Carbon Black" Revised Date: May 25, 2015 http://www.continentalcarbon.com/pdfs/CancarbN990.pdf, accessed Mar. 24, 2018 (Year: 2015).*
(Continued)

*Primary Examiner* — Magali P Slawski
(74) *Attorney, Agent, or Firm* — Pauley Erikson & Swanson

(57) ABSTRACT

A hybrid solar system including a hybrid solar collector using non-imaging optics and photovoltaic components and a heat transfer and storage system in thermal communication with the hybrid solar collector, the heat transfer and storage system using particle laden gas as thermal media to simultaneously generate and store electricity and high temperature dispatchable heat.

15 Claims, 8 Drawing Sheets

Related U.S. Application Data

(60) Provisional application No. 62/087,511, filed on Dec. 4, 2014.

(51) Int. Cl.
*H02S 40/22* (2014.01)
*H02S 40/44* (2014.01)
*F24S 23/70* (2018.01)

(52) U.S. Cl.
CPC ............ *F24S 23/80* (2018.05); *F24S 2023/84* (2018.05); *Y02E 10/52* (2013.01); *Y02E 10/60* (2013.01)

(56) References Cited

U.S. PATENT DOCUMENTS

| | | | | |
|---|---|---|---|---|
| 4,238,247 A | * | 12/1980 | Oster, Jr. | ............... H01L 31/055 136/247 |
| 4,313,304 A | | 2/1982 | Hunt | |
| 4,770,232 A | * | 9/1988 | Chubb | .................... B64G 1/50 165/41 |
| 2006/0260605 A1 | * | 11/2006 | Connor | ............... H01L 31/0547 126/561 |
| 2012/0227782 A1 | * | 9/2012 | Tsai | ....................... H01L 31/05 136/244 |
| 2013/0298964 A1 | * | 11/2013 | Nunez Bootello | ..... H02S 40/44 136/246 |
| 2016/0163943 A1 | | 6/2016 | Cygan et al. | |

OTHER PUBLICATIONS

Cancarb., "Safety Data Sheet: Cartoon Black," Revised Date: May 25, 2015, http://www.continentalcarbon.com/pdfs/CancarbN990.pdf, accessed Mar. 24, 2018 (Year: 2015).

* cited by examiner

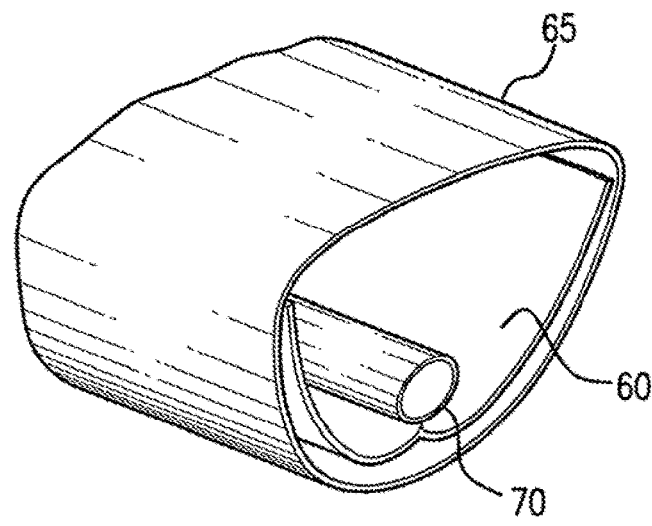
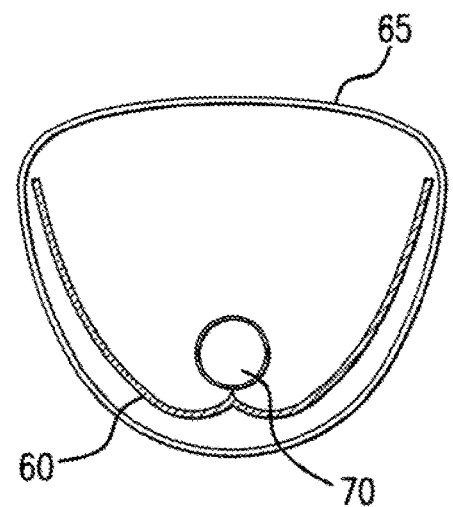
FIG. 7A  FIG. 7B
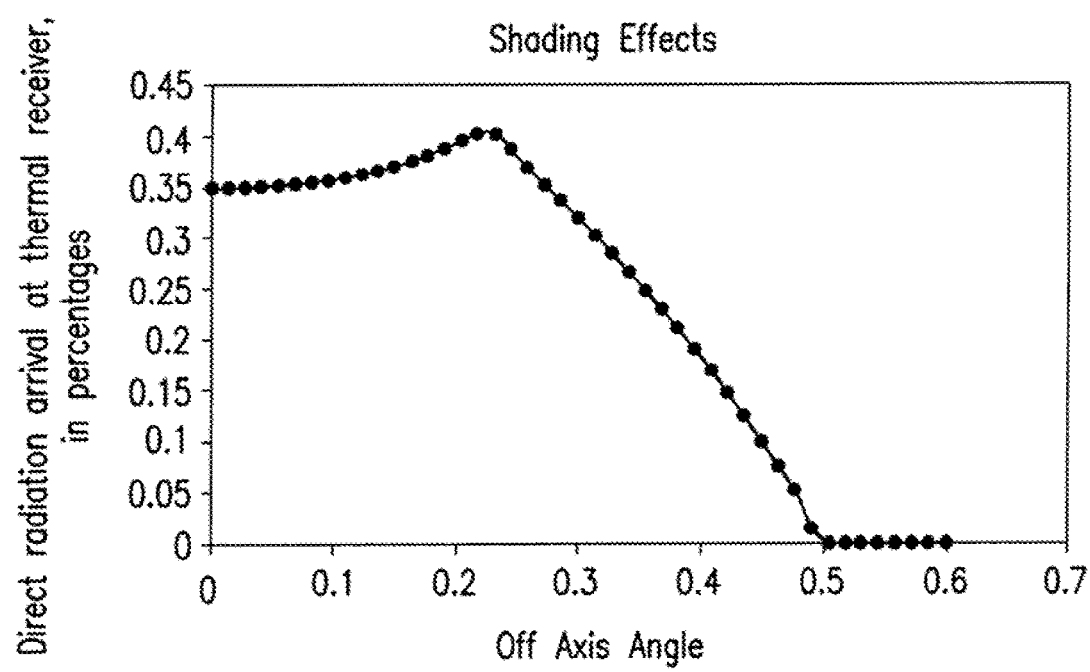
FIG. 8

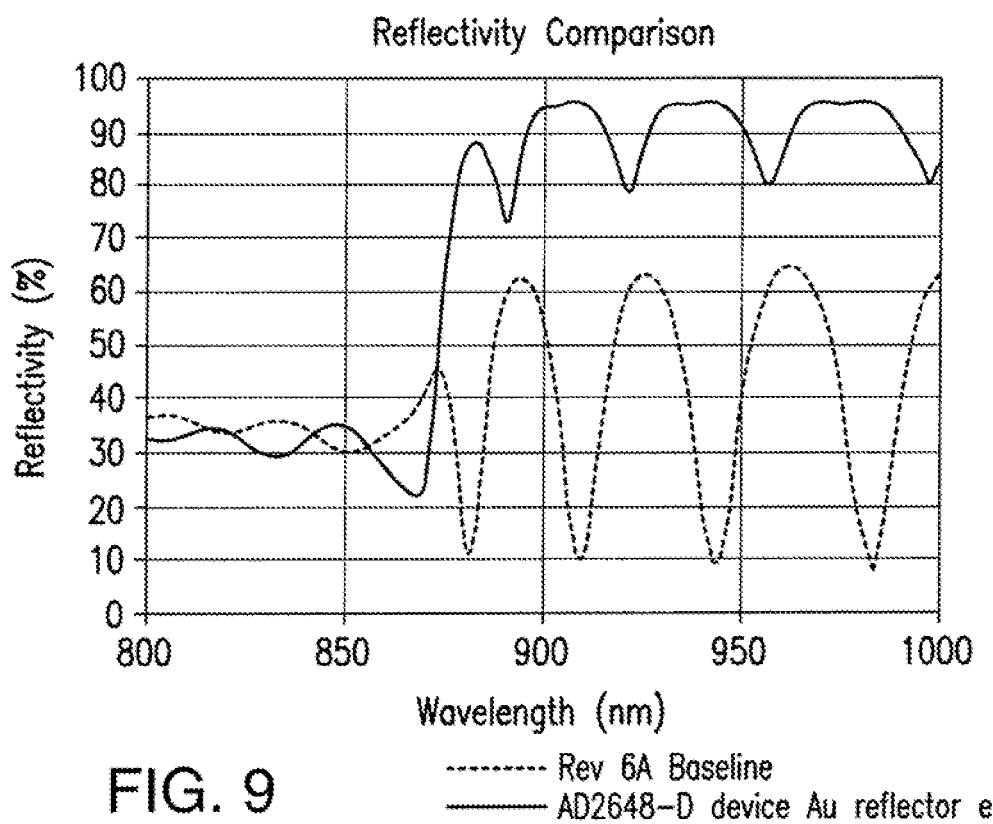
FIG. 9  ------- Rev 6A Baseline
——— AD2648-D device Au reflector example
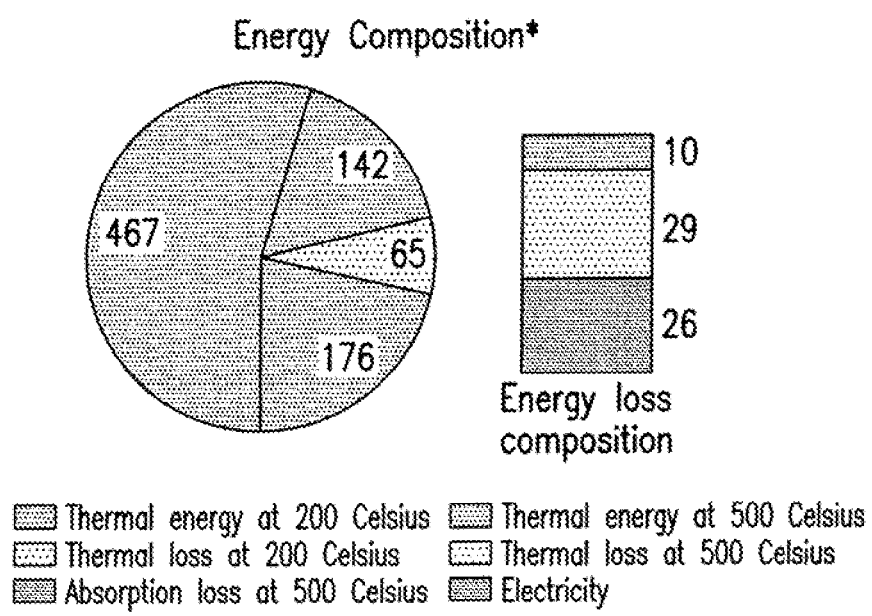
▨ Thermal energy at 200 Celsius  ▨ Thermal energy at 500 Celsius
▨ Thermal loss at 200 Celsius  ▨ Thermal loss at 500 Celsius
▨ Absorption loss at 500 Celsius  ▨ Electricity
* Based on 850W/m² incoming solar radiation,
All W/m² based on the aperture area of the
primary reflector
FIG. 10

HYBRID SOLAR SYSTEM

CROSS-REFERENCE TO RELATED APPLICATIONS

This application is a continuation application of U.S. patent application Ser. No. 14/959,874, filed on 4 Dec. 2015 which claims the benefit of Provisional U.S. Patent Application Ser. No. 62/087,511, filed 4 Dec. 2014. The parent patent application is hereby incorporated by reference herein and is made a part hereof, including but not limited to those portions which specifically appear hereinafter.

STATEMENT REGARDING FEDERALLY SPONSORED RESEARCH OR DEVELOPMENT

This invention was made with government support under grant ARPA-E DE-AR0000464 awarded by the U.S. Department of Energy (DOE). The government has certain rights in the invention.

BACKGROUND OF THE INVENTION

Field of the Invention

This invention relates generally to a hybrid solar system.

SUMMARY OF THE INVENTION

The hybrid solar system (HSS) according to a preferred embodiment of this invention integrates a hybrid solar collector (HS Collector) using non-imaging optics (NIOs) and photovoltaic (PV) components with a heat transfer and storage system (HTS System) using particle laden gas as thermal media to simultaneously generate electricity and high temperature dispatchable heat. The HS collector preferably transforms a parabolic trough, commonly used in concentrated solar power (CSP) plants, into an integrated spectrum-splitting device. This places a spectrum-sensitive topping element on a secondary reflector that is registered to the thermal collection loop. The secondary reflector transmits higher energy photons for PV topping while diverting the remaining lower energy photons to the thermal media.

The subject invention preferably further utilizes the spectral selectivity property of Gallium Arsenide (GaAs) cells to maximize the exergy output of the system. The thermal media is preferably comprised of fine particles of high melting point, high thermal conductivity and, if desired, high radiation absorptive material in a gas. The particle laden thermal media not only increases direct solar radiation absorption when used in a transparent receiver, but may also allow operation up to the melting point of the solid particles. It simultaneously increases thermal conductivity and heat transfer coefficient, and allows for effective storage of excess heat in hot solid particles for later on-demand use. Depending on availability of suitable high temperature materials filtration technologies, this type of thermal media should be capable of operating at high temperatures allowing further expansion in the future to deliver high efficiency power.

BRIEF DESCRIPTION OF THE DRAWINGS

These and other objects and features of this invention will be better understood from the following detailed description taken in conjunction with the drawings, wherein:

FIG. 7A is a perspective view schematic of an example of the structure of a topping device according to one preferred embodiment of the invention.

FIG. 7B is a front view schematic of the structure of a topping device shown in FIG. 7A.

FIG. 8 is a graph of percentage of radiation that directly arrives on the secondary thermal receiver based on the off-axis angle in simulation according to one preferred embodiment of the invention.

FIG. 9 is a graph of the reflectivity testing of GaAs cell according to one preferred embodiment of the invention.

FIG. 10 is a graph of the output and losses of the topping device according to one preferred embodiment of the invention.

DETAILED DESCRIPTION

Figure 1:
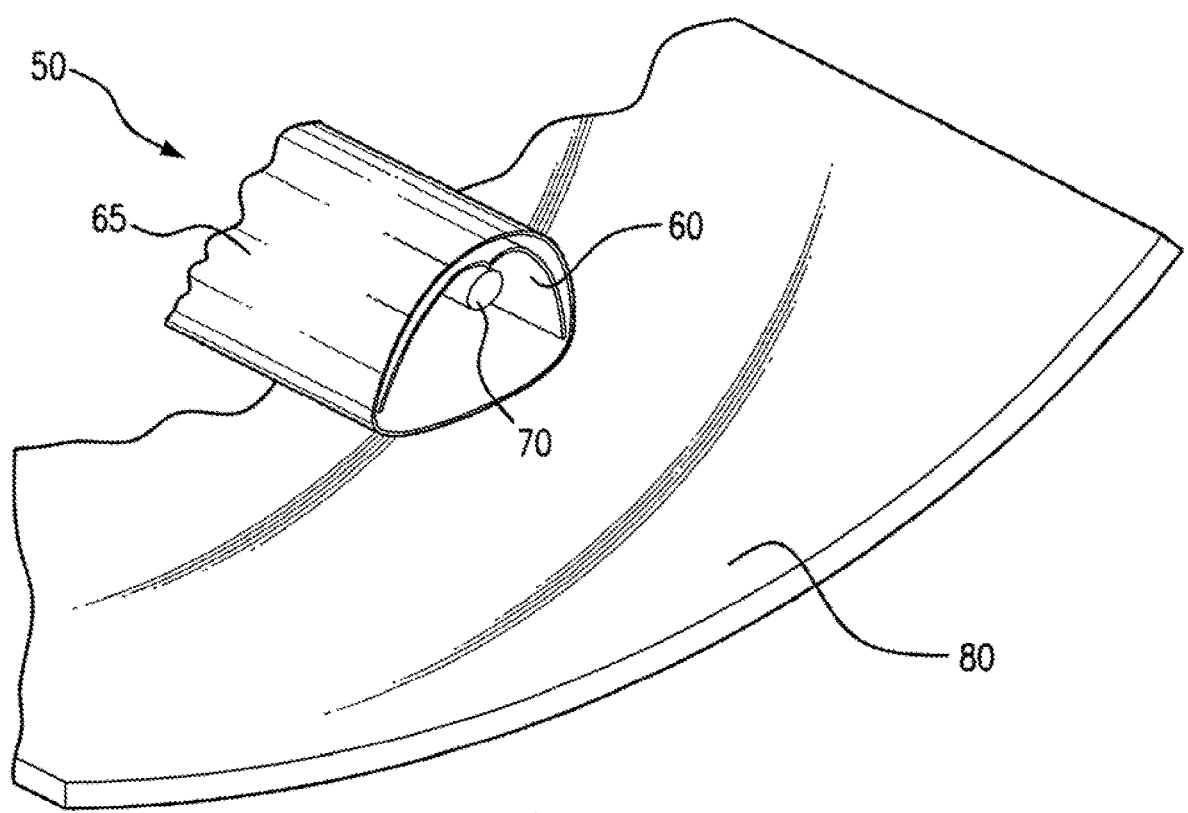
FIG. 1 is a schematic of an integrated spectrum-splitting solar collector (drawing is not according to dimension) according to one preferred embodiment of the invention.

As described in greater detail below, the invention generally relates to a hybrid solar system such as shown schematically in FIG. 2. The hybrid solar system (HSS) 10 according to a preferred embodiment of this invention integrates a hybrid solar collector (HS Collector) 20 using non-imaging optics (NIOs) and photovoltaic (WV) components with a heat transfer and storage system (HTS System) 30 using particle laden gas as thermal media to simultaneously generate electricity and high temperature dispatchable heat.

According to a preferred embodiment of the invention, the HS collector 20 transforms a parabolic trough, commonly used in concentrated solar power (CSP) plants, into an integrated spectrum-splitting device. This places a spectrum-sensitive topping element on a secondary reflector that is registered to the thermal collection loop. The secondary reflector transmits higher energy photons for PV topping while diverting the remaining lower energy photons to the thermal media, achieving temperatures of ~400 to 500° C. even under partial utilization of the solar spectrum, it uses the spectral selectivity property of Gallium Arsenide (GaAs) cells (preferred, but other cell material may also be suitable) to maximize the exergy output of the system, resulting in an estimated exergy efficiency of over 40%. The thermal media preferably comprises fine (preferably <100 micron) particles of high melting point, high thermal conductivity and, if desired, high radiation absorptive material (carbon, aluminum nitride, alumina, silicon, graphite, graphene etc.) in a gas ($N_2$, $CO_2$, air etc.). The particle laden thermal media not only increases direct solar radiation absorption when used in a transparent receiver, but may also allow operation up to the melting point of the solid particles. Preferably, this arrangement simultaneously increases thermal conductivity and heat transfer coefficient, and allows for effective storage of excess heat in hot solid particles for later on-demand use. Depending on availability of suitable high temperature materials filtration technologies, this type of thermal media should be capable of operating at temperatures as high as 1000° C. or even higher. This allows extending to much higher temperature solar systems in the future to deliver high efficiency power.

The HSS technology preferably integrates innovations in collector design and heat transfer and storage to deliver variable electricity at a competitive cost together with on-demand heat. Using NiOs, a parabolic trough commonly used in CSP plants is transformed into an integrated spectrum-splitting device to place a spectrum-sensitive topping element on a secondary reflector associated with the thermal collection loop. The secondary reflector will transmit higher energy photons for PV topping, while diverting the remaining lower energy photons to a high temperature thermal collection system. In one embodiment, the design could be implemented in a retrofit mode, thereby adding exergy value to existing plants. By using NIOs, a ~75× concentration ratio is achieved which is significantly higher than the conventional parabolic trough concentration ratios. This helps the secondary thermal receiver to achieve higher temperatures even under partial utilization of the solar spectrum.

Based on a conventional 5 m wide parabola, the design preferably incorporates both a primary photovoltaic/thermal topping device and a secondary thermal receiver. It uses the spectral selectivity property of GaAs (or a comparable alternate) cell to maximize the exergy output of the system. The cell serves three purposes: 1) the spectral splitter/concentrator; 2) the selective thermal receiver at a medium temperature (~200° C.); and 3) the electric receiver. One feature of the design is that it provides enough geometric concentration on both receivers to maintain their efficiencies at the operating temperatures. On the primary topping device, a geometrical concentration of ~13× is achieved to maintain the ~200° C. working temperature. The ratio from parabolic aperture width to the thermal receiver tube circumferences is ~75×, so the efficiency is kept above 50% at 400 to 500° C.; even though only a portion of the solar spectrum is redirected to it based on properties of the cell.

With reference to FIG. 1 within the topping device, a preferred cell 50 preferably includes a GaAs reflector 60 serving as the wide acceptance angle, secondary concentrator for the high-temperature thermal receiver 70, preferably formed in a tube shape. A tube 65 is preferably formed over the GaAs reflector 60, preferably in a similar size to minimize footprint and maximize efficiency. The cells are attached to a nonimaging shaped reflector/heat sink 80 (which may be made from using multiple flat panels), which enables the GaAs reflector 60 itself to operate at ~200° C. as a heat source. The GaAs reflector 60 is preferably greater than 85% reflective, at sub-bandgap photon energies, making it an efficient spectrally selective reflector. It preferably reflects wavelengths above 870 not (the bandgap of GaAs), as well as converting the energy that is not converted into electricity into thermal output. The high temperature tube receiver 70, working under the concentration ratio of ~75×, which accepts both the direct input of the primary parabolic and the sub-bandgap energy from the GaAs reflector 60 reflection, can achieve up to 500° C. under vacuum.

The thermal media is preferably comprised of fine (preferably <400 micron) particles of high melting point, thermal conductivity, and radiation absorptive material (carbon, iron oxide etc.) in a gas ($N_2$, $CO_2$, air etc.). The particle laden fluid not only increases the solar radiation absorption, when used in a transparent receiver to be considered in future development stages, but may also allow for operation up to the working temperature of the solid particles. By proper selection of solid material, simultaneous increases in thermal conductivity and heat transfer are possible, while also providing effective heat storage at high temperature for on-demand use.

Figure 2:
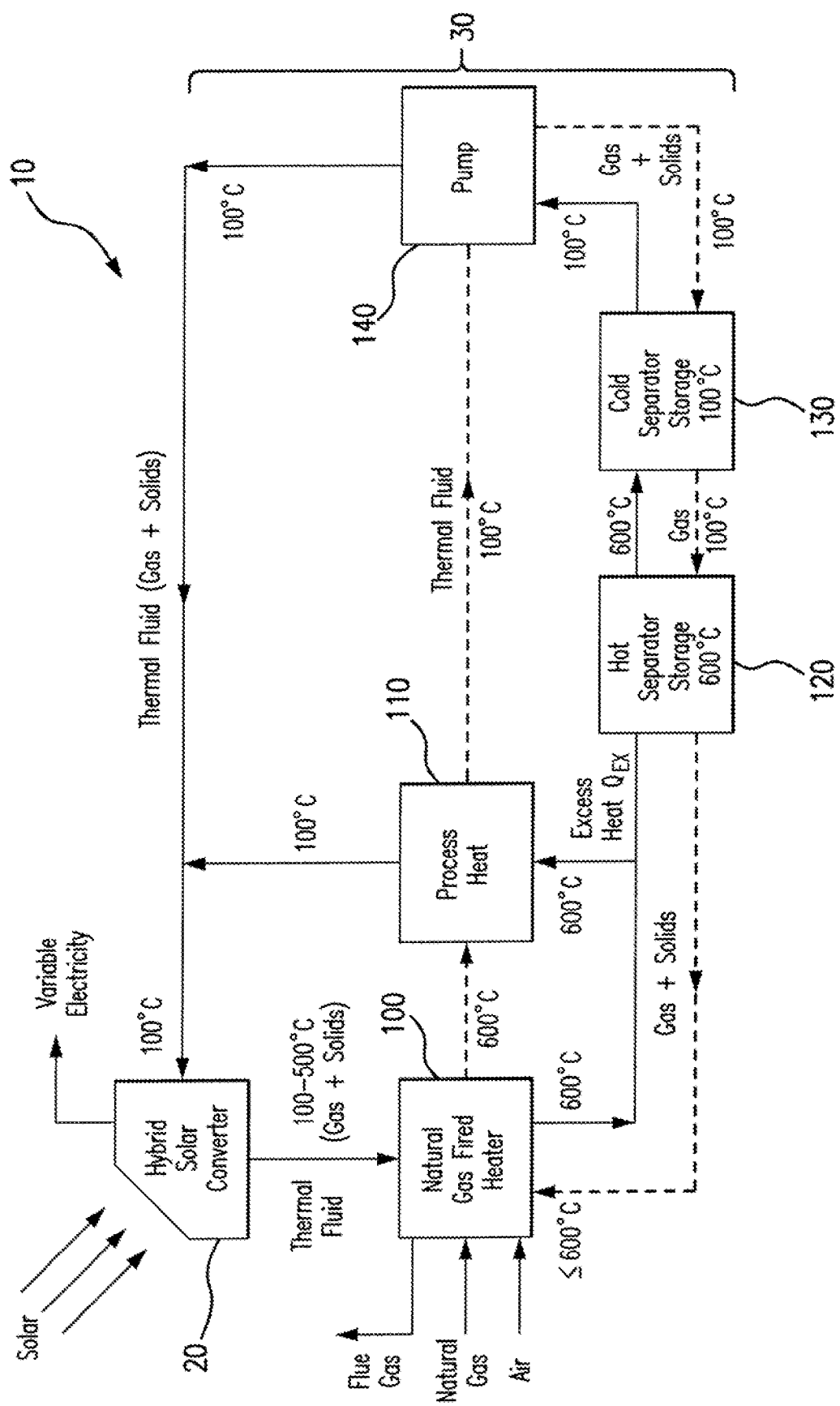
FIG. 2 is a flow diagram of an example hybrid solar system process (assumes heat sink drops temperature to 100° C.) according to one preferred embodiment of the invention.

As illustrated as an example of a possible flow diagram in FIG. 2, hot media goes through an optional supplementary natural gas fired heater 100, to increase its temperature to provide the desired point of use levels, for when the solar radiation levels are insufficient to generate the require process temperatures. The hot media then flows to the heat sink 110, transferring the heat to the work load (process heating or for power generation). The cooler fluid, at an assumed 100° C., returns to the solar collector 20 for reheating. According to this embodiment, any excess media (heat) flows to a first storage container 120 equipped with a hot gas filter (cyclone, high temperature filter bag, ceramic membrane) for separation and storage of the hot particles. The mostly particle-free hot gas then picks up cooler particles from a second storage container 130 before returning to the collector. When the solar intensity drops below a set threshold, the flows are reversed as shown by dashed lines. Hot particles are picked up and heat is transferred to the process load. The resulting cooler particles are separated and stored. The thermal media may be circulated with a pump 140.

Figure 3:
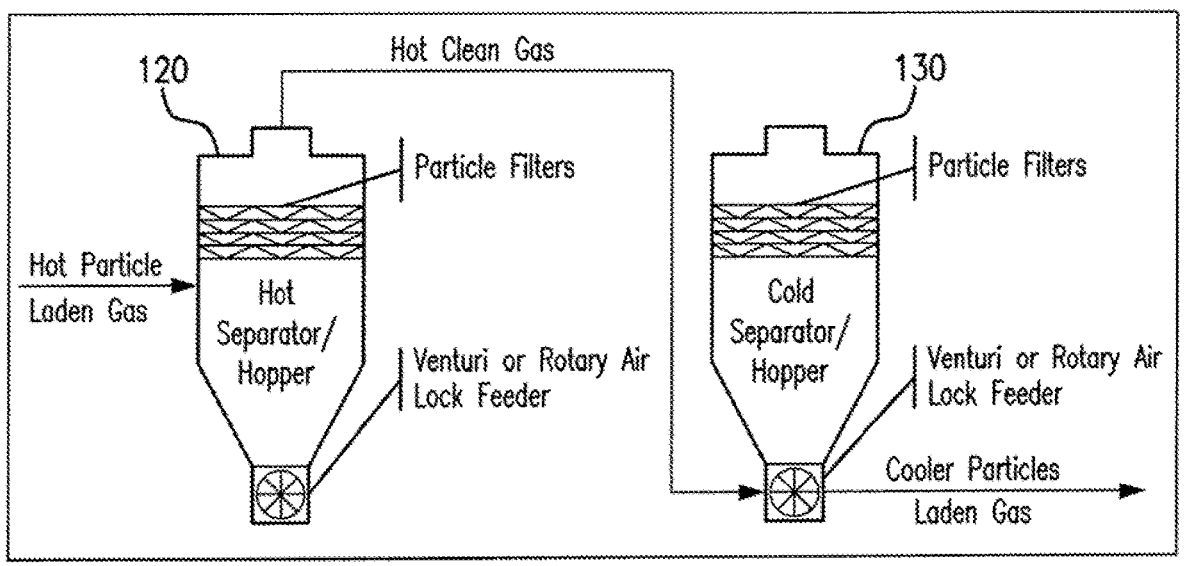
FIG. 3 is a schematic of a design of particles separation, storage and feeding vessels (note the filters may could be fabric, ceramic or cyclone depending on process needs according to one preferred embodiment of the invention.

FIG. 3 shows one embodiment of the separation, storage, and feeding vessels, termed first storage container 120 and second storage container 130 herein. The concept is based on designs used in the bulk powder industry for storage and transport of powders, with modifications to allow use at the proposed elevated temperatures. Since complete particle separation is not necessary in a closed loop system, high temperature fabric and ceramic based systems as well as cyclone separators are considered. Use of fabric bags, however, may require a reduction in the upper temperature limit.

Figure 4:
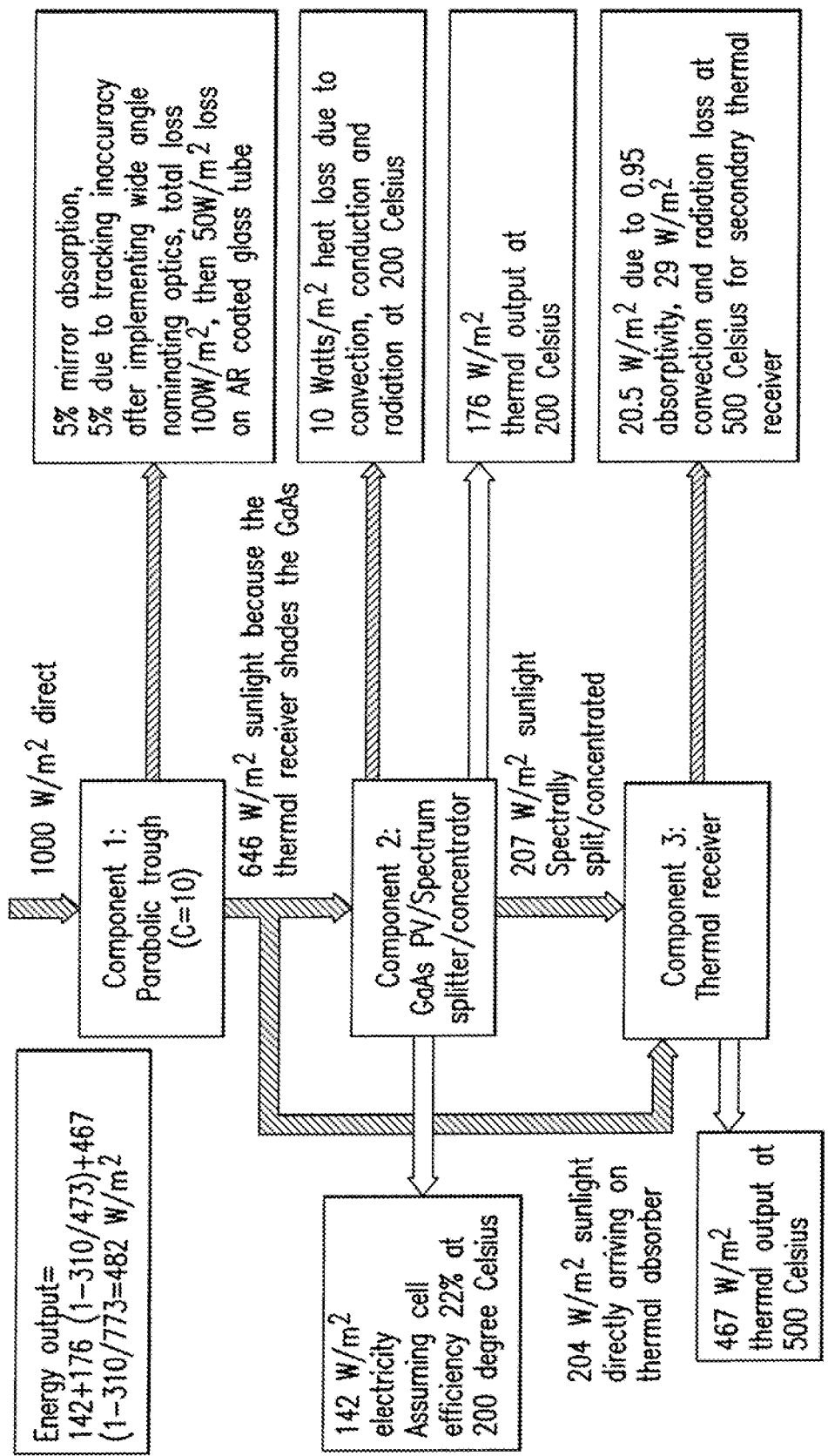
FIG. 4 is an example solar hybrid collector block diagram according to one preferred embodiment of the invention.

FIG. 4 shows an example block diagram for the HS Collector 20. The total estimated exergy output is 482 W/m$^2$ providing an overall exergy efficiency of 48.2%. Preliminary specifications for the HTS System 30 are shown in FIG. 4.

The application of this concept should lead to the development of more thermodynamically efficient thermal designs as well as higher efficiency solar cells. Therefore, if back ray tracing is performed, the thermodynamically efficient solar concentration design will enable its receiver to only "see" the designated origin of the sky which includes the solar radiation as well as tracking and structural inaccuracies. Compared to the conventional method of optical design, which is pursuing high concentration, the HS Collector design puts emphasis on the "thermodynamic efficiency", or how much the receiver "sees" is the part of the sky that is of interest, namely the sun disk. Maximizing this percentage to be as close as possible to 1 is the goal.

The solar cells in the HS Collector will preferably be the GaAs, which has the highest efficiency known for a single material—nearly 30% sunlight to electricity. In the HS Collector design, the cells need only occupy~10% of the area, and still intercept all the sunlight falling on the trough, making these cells very affordable. Even heat of the solar cell is collected, at a somewhat lower temperature; no solar energy is wasted, or at least as little as possible given the limitations of materials.

Another benefit of the present HSS invention is in heat management and delivery. The HTS System preferably uses particle laden gas as a two-phase thermal media to both transport and store heat. While providing high levels of solar energy absorption, heat capacity and thermal conductivity for direct application of solar heating increases up to 600° C. and potentially much higher. The concept involves mixing fine (preferably <100 micron) particles of high melting point, thermal conductivity and radiation absorptivity material (carbon, iron oxide etc.) with an inert gas ($N_2$, $CO_2$, air etc.) to create the thermal media. The particle laden media will not only increase the solar radiation absorption but will also allow operation up to the melting point of the solid particles and simultaneously increase the thermal conductivity and heat transfer coefficient. As illustrated in FIG. 2, the solar energy heats the thermal fluid to a high temperature depending on the process needs, collector design and solar intensity. The hot fluid goes through a supplementary natural gas fired heater if needed, to increase its temperature to the desired levels, for example when the solar radiation levels are insufficient to generate the required process temperatures. The hot fluid then flows to the process heat exchanger and transfers heat to the work load (process heating, power generation). The cooler fluid then returns to the solar collector for reheating.

Performance of Proposed Solution and its Advancement

Figure 5:
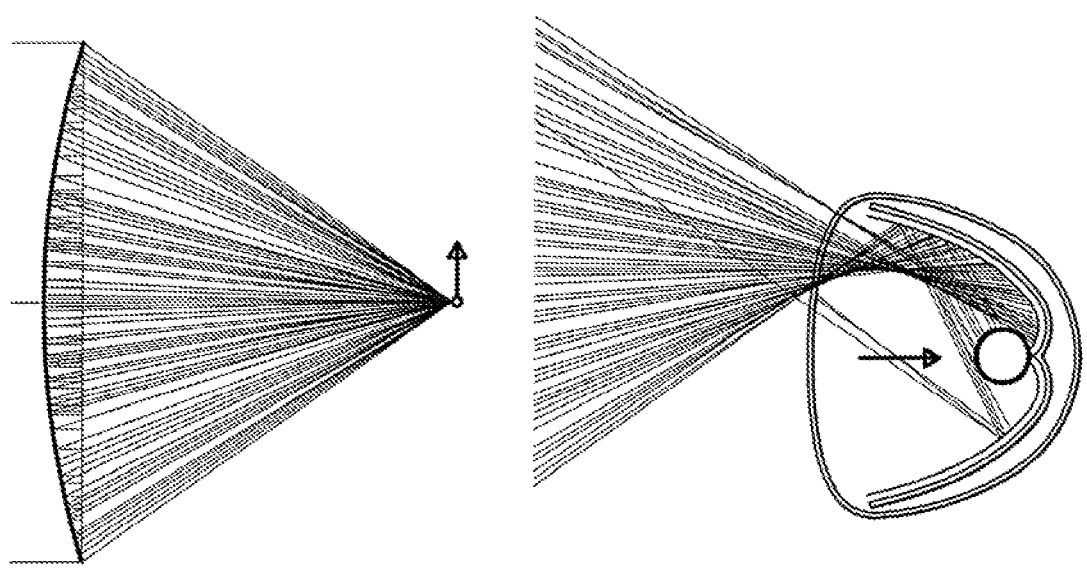
FIG. 5 is a graph showing ray tracing results wherein the right graph shows enlarged receiver area according to one preferred embodiment of the invention.
Figure 6:
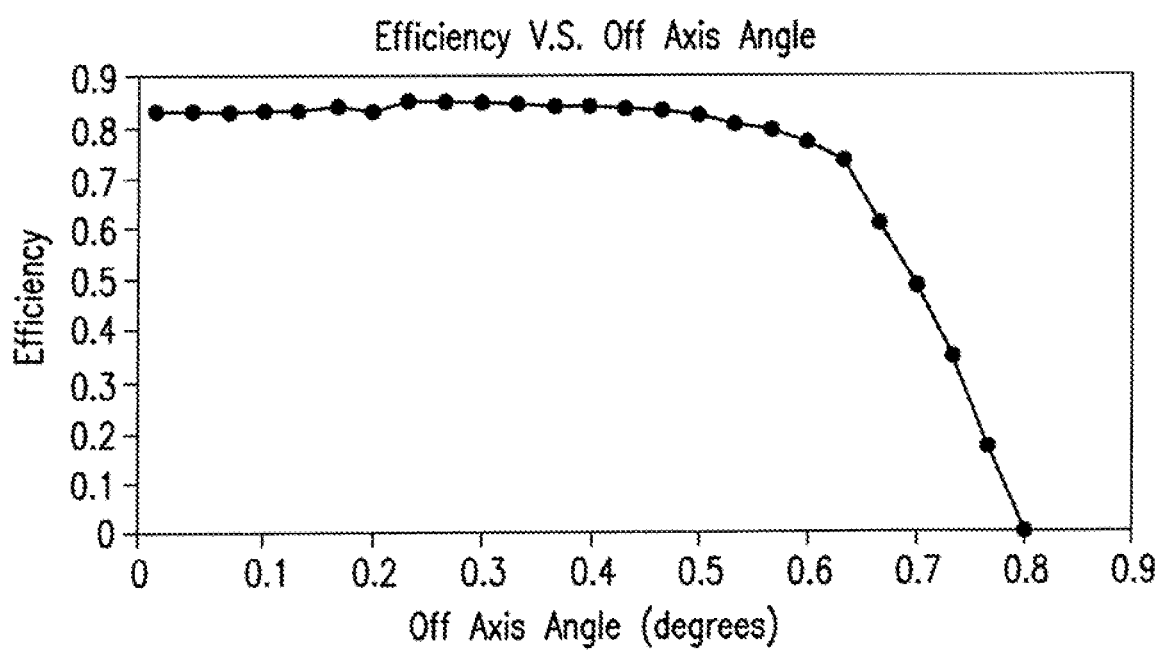
FIG. 6 are off-axis ray tracing results according to one preferred embodiment of the invention.
Figure 11:
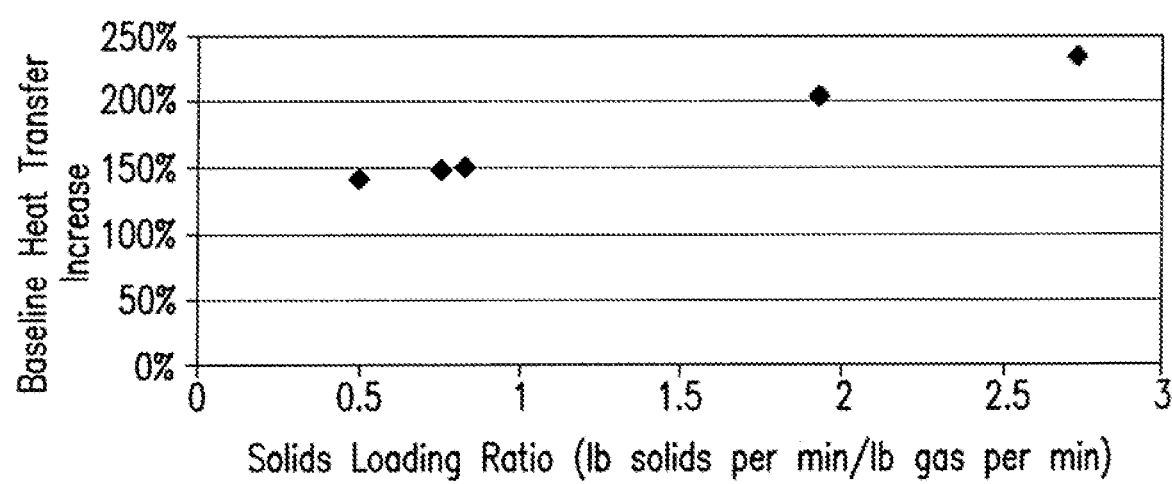
FIG. 11 is a graph showing the effect of particle loading on heat transfer according to one preferred embodiment of the invention.

To understand the performance of the HS Collector, an optical software has been used to ray trace the design as shown in FIG. 5. The efficiency according to the off-axis angle is shown in FIG. 6. The design of the topping device, is illustrated in FIGS. 7A and 7B.

The device preferably comprises the following parts: 1) an outer glass tube 65 shaped similar to the NIOs to minimize the size of the device; 2) enhanced structure thermal media channel for the purpose of 200° C. heat transfer, which also serves as the reflector/concentrator; 3) thin film GaAs cell 60 attached to the NIO; 4) selectively coated absorber tube 70 for the thermal media working at 500° C.; 5) either single end metal glass sealing or double ends sealing with the bellows, allowing the thermal media to pass through; and 6) electric leads.

In an example design demonstrated in FIG. 8, based on the shading effects of the secondary thermal receiver on the GaAs cell, 76% of the light coming into the device arrives onto the GaAs for the purpose of direct electricity generation. This produces ~142 W/m² electricity, based on the solar cell efficiency of ~22% at ~200° C. (dropping from ~29% at room temperature). According to the testing report of UCM's GaAs cell at National Renewable Energy Laboratory (NREL) as shown in FIG. 9, the reflectivity beyond bandgap (870 nm) towards visible light averages~0.31 (due to the high refractive index of GaAs), and the reflectivity sub-bandgap (towards infrared) averages~0.879. This provides the reflective property of the GaAs to be highly selective, minimizing the energy loss that cannot be used for PV effect to be redirected to the higher temperature thermal receiver. This enables the exergy output to be high for the device and keeps it thermodynamically efficient. The total reflected energy from GaAs is ~318 W/m², which is collected on the secondary thermal receiver. The solar cells generate~176 W/m² of heat at ~200° C. As a result, the solar resource for ~200° C. is only~2.2 kW/m² by energy density for the low temperature thermal purpose. Therefore, a vacuum is needed for keeping this part of the energy to be utilized at high efficiency. The vacuum can cut off the convection and conduction heat loss, therefore in the HS Collector design, the only heat loss is radiation loss of about 10 W/m² due to the high reflectivity of the GaAs in IR region, which is less than ~5% of the thermal output at ~200° C.

The secondary thermal receiver working at ~500° C. receives energy both directly from the primary reflector (parabola) and the GaAs cell reflection, which is in total~522 W/m² solar resource, this accounts for more than ~61% of the solar resource arriving on the topping device. Out of this resource, ~26 W/m² loss comes from the ~0.95 absorptivity, and ~29 W/m² comes from working at 500° C. and 0.08 emissivity at this temperature.

FIG. 10 shows the total energy composition of the collector, assuming 150 W/m² is already lost due to the first reflector and transmissive loss of the glass tube.

The HS Collector technology according to the subject invention has the potential to significantly upgrade the value of the parabolic troughs already installed at megawatt scales, while similarly adding value to future parabolic trough plants. This advance in technology is made possible by a) NIOs and b) the novel thin film GaAs cells which combine the high conversion efficiency of solar light to electricity. This arrangement provides the ability to spectrally separate the short wavelength solar spectrum used for direct electricity production from the long wavelength portion usable for high temperature heat. In this way, the parabolic trough is a source of direct electricity, for example, for peak loads, mid- to high-temperature heat for various purposes, or stored for of peak electricity production. Very importantly, it would give significantly added value to existing parabolic trough plants by a straightforward and low cost retrofit procedure.

The proposed approach of using a particle laden gas as combined heat transfer and storage media offers a number of benefits over current technologies suitable for temperatures around 500° C. or higher, the target range for the proposed technology. Benefits include allowing direct absorption of solar energy into solid particles, when using receiver made from solar radiation transmissive material. In addition, the system permits use of a single dosed loop combining both energy transfer and storage. Further, there is availability of a wide range of materials offering performance-costs trade-offs. There are additionally no direct link between temperature and pressure of the fluid in the closed loop system contemplated by the invention.

Other benefits include the potential to achieve temperatures over 1000° C., limited only by the ability of transport and storage equipment to handle the hot HTS media, creating opportunities for possible future extension to higher temperature solar systems. The system further permits direct contact storage and recovery of heat for higher efficiencies and fewer exchange surfaces. Costs of the subject system may be controlled through choice of materials. Advantages of the contemplated media over molten salts include less sensitivity of viscosity to temperature, no need to maintain temperatures above melting point to avoid solidification/freezing, no side reactions, noncorrosive, and potential for much higher temperatures.

Test Examples

Tests carried out using expanded graphite in air demonstrated significant increases in heat transfer rates compared with particle-free air. The objective of the tests was to assess heat transfer impacts of adding solid powder to a gas, the ability to maintain flow, and the ability to separate the particles from gas. A bench scale particle heat transfer fluid test stand designed as a tool for the investigation of entraining fine thermally conductive powders in a gas flow for use as a high temperature thermal transport fluid.

The test stand is constructed from V inch stainless steel tubing running through two high temperature electric tube heaters for heating the material under investigation. Air flow through the test stand is measured using a variable area flow meter installed upstream of the powder feed. The powder is added through a small hopper/funnel attached to a piping tee installed in the main tubing run by opening a small gate valve located above the feed port. The motive force to move both the gas and the test material is a HEPA vacuum attached at the outlet of the tubing, run after a fan cooled coil. The use of the HEPA vacuum allows for the efficient collection, post-test measurement, and reuse of the test material. The test stand can heat materials up to 1200° C. at low throughput, but this temperature decreases rapidly as the throughput increases. Currently the test stand is configured with four thermocouples to measure the temperature of the gas/powder mixture: before the first heater; between the heaters; after the second heater; and after the chiller.

FIG. 12 shows the relationship between heat transfer increase over particle-free air as a function of particle loading. These tests were carried out at an air flow rate of 2.5 scfm and temperature of approximately 200° C. using expanded graphite as the particles. The graphite has a density of 16.63 ft$^3$/lbm, specific heat of 0.242 Btu/lbm*° F. and thermal conductivity of 150 W/(k·m) at 200° C. As shown, heat transfer increased linearly with particle loading reaching 2.5 times at a particle loading of 2.5. Higher loading tests were not run, because of the limited scope of the effort and limitations of the equipment. No issues with maintaining flows were observed and the HEPA filter equipped vacuum was able to effectively capture the particles, with no visible dust observed either during or after the tests on or around the vacuum.

It will be appreciated that details of the foregoing embodiments, given for purposes of illustration, are not to be construed as limiting the scope of this invention. Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention, which is defined in the following claims and all equivalents thereto. Further, it is recognized that many embodiments may be conceived that do not achieve all of the advantages of some embodiments, particularly of the preferred embodiments, yet the absence of a particular advantage shall not be construed to necessarily mean that such an embodiment is outside the scope of the present invention.

We claim:

1. A hybrid solar system comprising:
    a hybrid solar collector comprising a central thermal receiver, the central thermal receiver surrounded by a non imaging optic forming a trough and with an outer tube surrounding both the non imaging optic and the central thermal receiver; and
    a heat transfer and storage system integrated with the hybrid solar collector, the heat transfer and storage system comprising solid particle laden gas as thermal media to simultaneously generate and store high temperature dispatchable heat at greater than 200° C.

2. The hybrid solar system of claim 1 wherein the hybrid solar collector comprises Gallium Arsenide cells.

3. The hybrid solar system of claim 1 wherein the hybrid solar collector comprises an outer glass tube having a thin film GaAs cell.

4. The hybrid solar system of claim 1 wherein the solid particle laden gas comprises fine particles having a diameter of less than 50 micron.

5. The hybrid solar system of claim 1 wherein the solid particle laden gas comprises fine particles having a high melting point of greater than 200° C. and a diameter of between 1 and 100 micron.

6. The hybrid solar system of claim 1 wherein the solid particle laden gas comprises an inert gas.

7. The hybrid solar system of claim 1 wherein the heat transfer and storage system includes a supplementary natural gas fired heater to increase a temperature of the solid particle laden gas when solar radiation levels are insufficient to generate required process temperatures.

8. The hybrid solar system of claim 7 wherein the heat transfer and storage system further comprises a heat sink positioned among the gas fired heater and a first storage container and a second storage container.

9. The hybrid solar system of claim 1 further comprising a pump positioned within the heat transfer and storage system to reverse flow of the particle laden gas.

10. The hybrid solar system of claim 1 wherein the heat transfer and storage system further comprises a first storage container capable of separating hot particle laden gas into hot particles and hot gases and a second storage container capable of separating cold particle laden gas into cold particles and cold gases.

11. A hybrid solar system comprising:
    a hybrid solar collector comprising a parabolic mirror and a central thermal receiver, the central thermal receiver surrounded by a thin film non imaging optic forming a trough and with an outer glass tube surrounding both the non imaging optic and the central thermal receiver;
    a thermal media comprising a solid particle laden gas; and
    a heat transfer and storage system integrated with the hybrid solar collector, the heat transfer and storage system including a natural gas fired heater and a heat sink in communication with a first storage container for separating particles from hot particle laden gas and a second storage container for separating particles from cold particle laden gas, wherein high temperature dispatchable heat at greater than 200° C. is simultaneously generated and stored.

12. The hybrid solar system of claim 11 wherein the hybrid solar collector comprises an outer glass tube having a thin film GaAs cell and a central high temperature receiver.

13. The hybrid solar system of claim 11 further comprising a pump positioned within the heat transfer and storage system to reverse flow of the particle laden gas.

14. The hybrid solar system of claim 11 wherein the particle laden gas comprises fine particles having a high melting point of greater than 200° C. and a diameter of between 1 and 100 micron.

15. The hybrid solar system of claim 11 wherein the particle laden gas comprises an inert gas.

* * * * *